United States Patent [19]

Gounji et al.

[11] Patent Number: 4,555,682

[45] Date of Patent: Nov. 26, 1985

[54] MECHANICAL FILTER

[75] Inventors: Takashi Gounji, Yokohama; Teruo Kawatsu, Kawasaki; Yoshihiko Kasai, Yokohama; Chikao Takeuchi, Kawasaki, all of Japan

[73] Assignee: Fujitsu Limited, Kawasaki, Japan

[21] Appl. No.: 582,768

[22] Filed: Feb. 23, 1984

[30] Foreign Application Priority Data

Mar. 2, 1983 [JP] Japan ................ 58-032936
Mar. 2, 1983 [JP] Japan ................ 58-032937
Mar. 4, 1983 [JP] Japan ................ 58-035302

[51] Int. Cl.$^4$ .............. H03H 9/50; H03H 9/54; H03H 9/13
[52] U.S. Cl. .................... 333/189; 333/186; 333/187
[58] Field of Search .......... 333/186, 187, 188, 189, 333/190, 191–192; 310/321, 330, 333, 346, 365–366, 368

[56] References Cited

U.S. PATENT DOCUMENTS 4,281,298 7/1981 Gounji et al. .............. 333/189
4,317,093 2/1982 Lungo ...................... 333/187

Primary Examiner—Marvin L. Nussbaum

[57] ABSTRACT

A mechanical filter including at least two longitudinal mode vibrators, each of which is a piezoelectric ceramic member with constant modulus alloy members mounted separately on the top and bottom surfaces thereof. The two constant modulus alloy members have the same configuration, a frequency-temperature characteristic opposite to that of the piezoelectric ceramic member, and are aligned, at their individual centers, with the center of the piezoelectric ceramic member. The configurations of the two longitudinal mode vibrators can be predetermined to suppress higher order spurious vibration modes inside the mechanical filter itself.

38 Claims, 24 Drawing Figures

MECHANICAL FILTER

BACKGROUND OF THE INVENTION

1. Field of the Invention

The present invention relates to a mechanical filter, more particularly to a mechanical filter comprising a pair of piezoelectric ceramic vibrators which vibrate in a longitudinal mode.

2. Description of the Prior Art

Mechanical filters are widely used as frequency selection devices in which electric signals are transformed into ultrasonic waves and vice versa. This type of filter produces numerous advantages, such as having a high Q compared with electric elements L and C, while maintaining or increasing stability and enabling the device itself to be of a small construction. Because of these advantages, the mechanical filter has been used as a channel filter for channel translating equipment or as a filter for navigation receivers or for PCM data transmission equipment.

Generally, each vibrator, i.e., an electromechanical transducer, having a piezoelectric ceramic material is fabricated in two different ways. First by mounting two piezoelectric ceramic materials separately on the top and bottom sides of a base metal plate, to form a sandwich structure, and second, by fabricating the vibrator from the piezoelectric ceramic material itself. The first type of vibrator is more popular than the second, however, the first type has a shortcoming in that it is not suitable for use as a wide band filter. The present invention specifically refers to a mechanical filter set up in accordance with the second type of vibrator, known as a ceramic filter. This type of ceramic filter is advantageous in cost but suffers from various problems, the first of which is that of poor stability with respect to temperature variations and aging. The second is that metal film electrodes are liable to peel away from the ceramic material because it is impossible to fix a support wire to metal film electrodes without using a soldering technique. Further, care must be taken during the manufacturing process, such as the cutting and grinding of the ceramic material, because the ceramic material itself is of a very brittle nature.

Furthermore, ceramic filters, and other mechanical filters, are usually required to cooperate with an external band pass filter assembled from electric components, i.e., coils and capacitors, in order to fully suppress the deleterious spurious vibration modes, inherent to mechanical filters. In this case, an electric band pass filter is connected at the input or output side of the mechanical filter. Under such circumstances, if such an external filter for suppressing the spurious mode can be eliminated, it would have the great advantage of substantially reducing the size of the filter structure.

SUMMARY OF THE INVENTION

It is an ojbect of the present invention to provide a mechanical filter which has, first, high stability with respect to the aforesaid temperature variations and aging, second, has strong resistance to external mechanical impact and, third, requires no external electric band pass filter for suppressing the spurious mode.

The above object is attained by a mechanical filter including at least two piezoelectric ceramic vibrators, each comprised of a piezoelectric ceramic member, which vibrates in a longitudinal mode, and constant modulus alloy members separately mounted on the top and bottom surfaces of the piezoelectric ceramic member. The constant modulus alloy members have the same configuration as each other, the center of each of these members is aligned with the center of the ceramic member, and further, each of these members has a frequency-temperature characteristic opposite to that of the ceramic member.

BRIEF DESCRIPTION OF THE DRAWINGS

The present invention will be more apparent with reference to the accompanying drawings, wherein.

DESCRIPTION OF THE PREFERRED EMBODIMENTS

Figure 1:
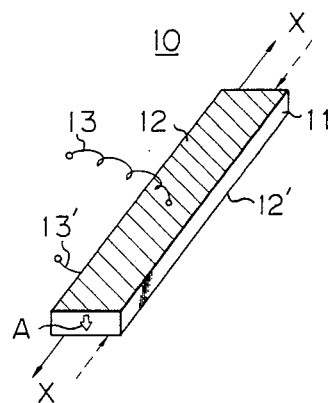
FIG. 1 is a perspective view of a conventional piezoelectric ceramic vibrator, upon which a piezoelectric ceramic vibrator of the present invention is based.

FIG. 1 is a perspective view of a conventional piezoelectric ceramic vibrator, upon which the piezoelectric ceramic vibrator of the present invention is based. In FIG. 1, reference numeral 10 represents a longitudinal mode vibrator, with the base made chiefly of a piezoelectric ceramic plate. The ceramic plate 11 is polarized in a direction along its thickness. The perpendicular polarization is schematically illustrated by an arrow A. It is known that the piezoelectric ceramic plate is usually first polarized and then put into actual use. Polarization is necessary if the ceramic plate is to exhibit linear distortion with respect to the cyclic change of an electric field applied to the ceramic plate. Metal films 12 and 12' are mounted separately on the top and bottom surfaces of the ceramic plate 11, to which metal films 12 and 12' an AC voltage is supplied to create the above-mentioned electric field. Thus, the vibrator 10 is made to vibrate in the longitudinal mode by utilizing the so-called transverse vibration effect, in which the vibrator distorts in a direction perpendicular to the direction in which the aforesaid electric field is created. The AC voltage for inducing the longitudinal vibration mode is supplied via leads 13 and 13'. In this case, the leads 13 and 13' are fixed to the individual metal films 12 and 12' by a soldering technique. Thus, the vibrator 10 vibrates alternately in the directions shown by the solid line arrows and broken line arrows X.

Figure 2:
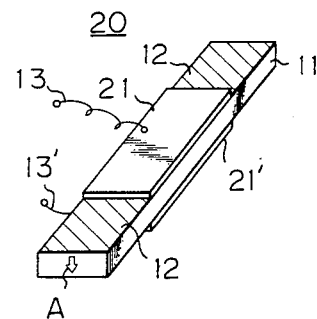
FIG. 2 is a perspective view of a basic piezoelectric ceramic vibrator commonly used in mechanical filters according to the embodiments of the present invention.

FIG. 2 is a perspective view of a basic piezoelectric ceramic vibrator commonly used in mechanical filters according to embodiments of the present invention. The identical members to those in FIG. 1 are represented by the same reference numerals or characters; this also applies to the later figures. A longitudinal mode vibrator 20, according to the present invention, is further provided with metal members made of a constant modulus alloy, i.e., metal strips 21 and 21'. These metal strips are used as electrodes to connect with the respective leads 13 and 13'. In addition, a support wire and a coupler (described hereinafter) are bridged between two adjacent vibrators, via individual metal strips. With reference to FIG. 1, the leads, the support wire, and the coupler are secured to the vibrator via the metal films 12 or 12', or both, directly. This means that the vibrator 10 has little mechanical strength. Accordingly, the thus constructed vibrator 10 suffers from the aforesaid problems regarding stability and stiffness. However, with the use of the vibrator 20 according to the present invention, such problems can be overcome, due to the presence of the metal strips. Furthermore, it is important to note that mechanical filters built with the vibrators 20 produce other advantages, as mentioned below in detail.

In FIG. 2, the metal strips 21 and 21' have the same configuration as each other. That is, two identical metal members are mounted separately on the top and bottom surfaces of the piezoelectric ceramic plate 11. If the metal strips 21 and 21' have different configurations, the vibrator 20 could not work in a longitudinal mode only, but would also work in an undesired flexural mode. The metal strips 21 and 21' are made of a constant modulus alloy, and it is known that the frequency-temperature characteristics of the constant modulus alloy can be controlled as intended by suitably selecting the heat processing temperature therefor. Thus, assuming that the peizoelectric ceramic member has a positive frequency-temperature coefficient, the aforesaid heat processing temperature for the constant modulus alloy is selected that the constant modulus alloy exhibits a negative frequency-temperature coefficient, and thereby, a compound vibrator assembled with both the ceramic plate and the constant modulus alloys exhibits a substantially zero frequency-temperature coefficient. Accordingly, temperature compensation can be attained by a compound vibrator assembled with the metal strips 21, 21' and the piezoelectric ceramic plate 11.

The metal strips 21 and 21' are positioned with respect to the piezoelectric ceramic plate 11 in such a manner that the centers of the three members are aligned with each other. This makes it possible to suppress undesired flexural vibration modes and also undesired vibration of the order of an even member. The length of these metal strips 21 and 21' should preferably be determined to be shorter than the length of the piezoelectric ceramic plate 11. In this case, the following two advantages can be obtained. First, the undesired spurious vibration mode can be easily removed from a mechanical filter containing at least the members 11, 21, and 21'. Second an input impedance and an output impedance of the mechanical filter can be easily adjusted to the desired values.

The longitudinal mode vibrator 20 vibrates when an AC voltage is applied via the leads 13 and 13' under the longitudinal mode of the first order, at a predetermined frequency. In this case the vibrator 20 also actually vibrates under the longitudinal mode of the order of a higher number, other than the first order mode. However, the longitudinal vibrations of the higher odd number order modes are spurious.

Figure 3:
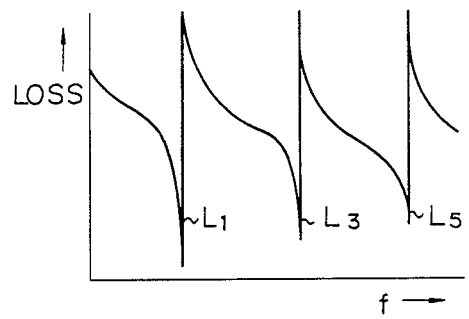
FIG. 3 is a graph depicting frequency response characteristics of the vibrator 20 shown in FIG. 2.
Figure 4A:
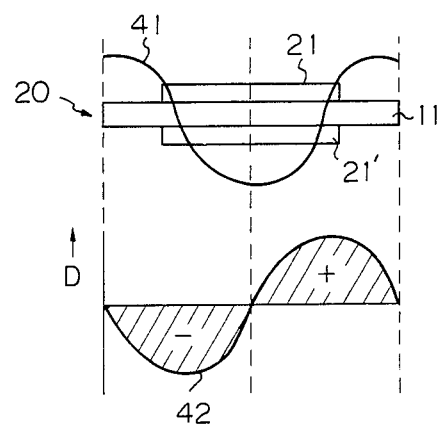
FIGS. 4A and 4B are schematic illustrations explaining how the even order spurious mode can be suppressed in the vibrator 20 shown in FIG. 2.
Figure 4B:
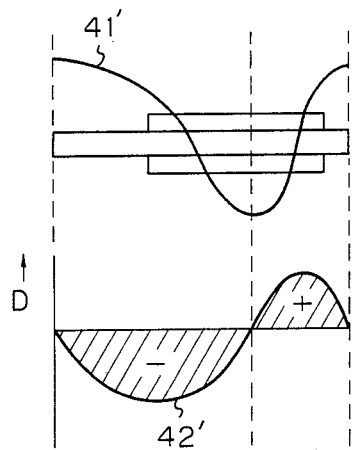

FIG. 3 is a graph depicting frequency response characteristics of the vibrator 20 shown in FIG. 2. The abscissa indicates a frequency (f) and the ordinate indicates a voltage attenuation loss (Loss). In the graph, characters $L_1$, $L_3$, and $L_5$ represent the response waveforms of the longitudinal first, third, and fifth order modes, respectively. As seen from the graph, the undesired spurious mode of the order of an even number cannot be provided. This is because the metal strips 21 and 21' have the same configuration and, in addition, the strips 21, 21' and the ceramic plate 11 are positioned in such a manner that their individual centers are aligned with each other. The details of the above will be further clarified below, with reference to a FIGS. 4A and 4B. FIGS. 4A and 4B are schematic illustrations explaining how the even order spurious mode can be suppressed in the vibrator 20 shown in FIG. 2. In FIGS. 4A and 4B, solid line curves 41 and 41' denote displacements of the vibrator 20, and solid line curves 42 and 42' denote distortions thereof. The distortion (D) induces positive (+) and negative (−) charges in the piezoelectric ceramic plate 11. When the members 21, 21', and 11 are aligned with respect to their individual centers, in the manner shown in FIG. 4A, the same amount of positive and negative charges are induced, and accordingly, the second order spurious mode can be suppressed. This is also true for other even number order spurious modes. However, if the members 21, 21', and 11 are not aligned with respect to their individual centers, in the manner shown in FIG. 4B, the charges induced amount of positive and negative are different. In this case, no suppression of the even number modes can be expected. That is, a symmetric arrangement necessarily suppresses the even number order spurious modes.

Figure 5:
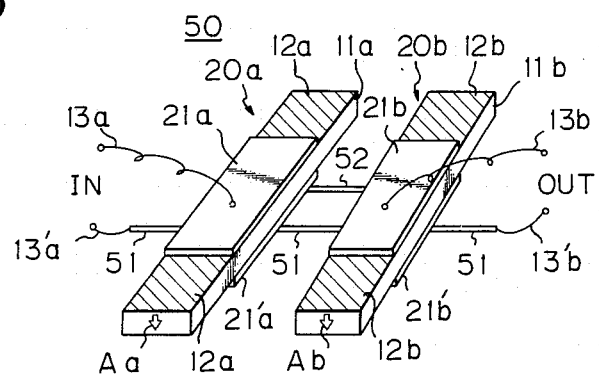
FIG. 5 illustrates a mechanical filter according to a first embodiment of the present invention.

FIG. 5 illustrates a mechanical filter according to a first embodiment of the present invention. The mechanical filter 50 is set up by using vibrators, each of which is identical to the vibrator 20 shown in FIG. 2. In the first embodiment, for example, two longitudinal mode vibrators are employed for the mechanical filter, and these two are differentiated from each other by the suffixes a and b. The reference numeral 51 represents a support wire, which is used to mechanically support the longitudinal mode vibrators 20a and 20b, as one body. The members 20a and 20b function as an input side vibrator and an output side vibrator, respectively. The support wire 51 is secured to individual vibrators 20a and 20b, at their nodal points. The nodal points exist, in this example, at the centers of the individual bottom metal strips 21'a and 21'b. The reference numeral 52 represents a coupler. However, a plurality of couplers can be used, if necessary. The coupler 52 mechanically couples the vibrators 20a and 20b. In this case, the coupler or couplers must not be coupled between the top metal strips (21a, 21b) and the bottom strips 21'a, 21'b), as this will cause the input and output of the mechanical filter to be electrically shorted. The ends of coupler 52 are attached to the metal strips 21'a and 21'b, at points other than the nodal points. The coupler 52 vibrates under a flexural mode. The thus fabricated mechanical filter 50 receives an input signal at its input IN and then produces a filtered output signal from its output OUT.

It is important to note that, in the mechanical filter 50, the largest spurious mode, i.e., the third order spurious mode, can be easily suppressed. Specifically, the suppression is easily attained by suitably selecting the ratio between the length of the metal strip and the length of the ceramic plate, as exemplified in FIG. 7.

Figure 6:
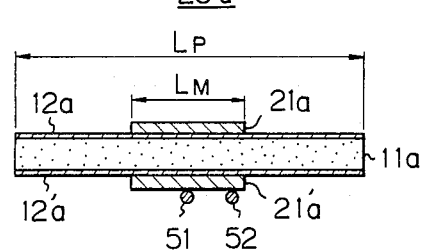
FIG. 6 is a cross-sectional view of the longitudinal mode vibrator 20a shown in FIG. 5.
Figure 7:
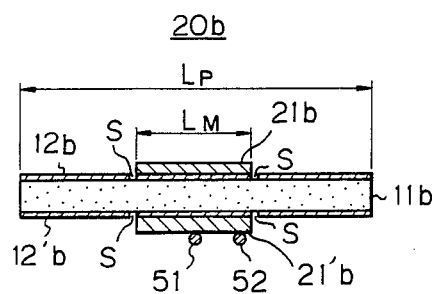
FIG. 7 is a cross-sectional view of the longitudinal mode vibrator 20b shown in FIG. 5.

FIG. 6 is a cross-sectional view of the longitudinal mode vibrator 20a shown in FIG. 5. FIG. 7 is a cross-sectional view of the longitudinal mode vibrator 20b shown in FIG. 5. In FIG. 7, slits S are formed in the metal films 12b and 12'b. The characters $L_P$ and $L_M$ denote the length of the piezoelectric ceramic plate 11b and the length of each metal strip 21b, 21'b. the aforesaid ratio between the lengths is determined so as to satisfy the following equation, $L_M \approx \frac{2}{3} L_P$. In practice, it is not necessary to form the slits S in the input side vibrator 20a and the output side vibrator 20b simultaneously.

Figure 8:
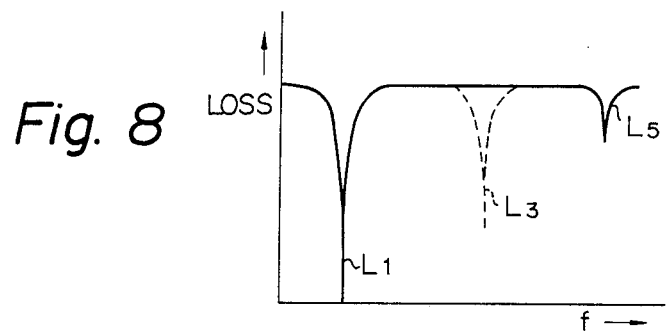
FIG. 8 is a graph depicting frequency response characteristics of the mechanical filter 50 shown in FIG. 5 which satisfy the relationship $L_M \approx \frac{2}{3} l_P$.

FIG. 8 is a graph depicting frequency response characteristics of the mechanical filter 50 shown in FIG. 5, which satisfy the relationship $L_M \approx \frac{2}{3} L_P$. The abscissa and ordinate indications are the same as those in FIG. 3. As is clear from the graph in FIG. 8, the third order spurious mode can be remarkably suppressed, merely by satisfying the aforementioned relationship. The next smaller spurious mode of a fifth order can be also suppressed by the mechanical filter 50 containing the vibration shown in FIG. 7. If it is necessary to suppress the fifth order spurious mode completely, it is possible to position the coupler 52 at the fifth order nodal point of each vibrator.

Figure 9:
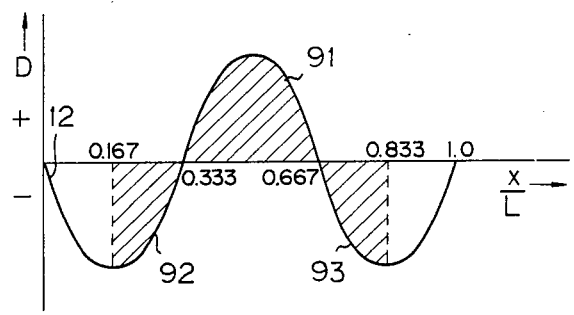
FIG. 9 is a graph for explaining how the third order spurious mode is suppressed.

FIG. 9 is a graph explaining how the third order spurious mode is suppressed. The abscissa (x/L) indicates a normalized length x by the whole length L of the piezoelectric ceramic plate (11a, 11b), where x is an intermediate arbitrary length along the whole length L. The ordinate indicates a distortion (D).

A piezoelectric ceramic member generally achieves a transformation from a mechanical distortion to an AC voltage, and vice versa, where positive and negative charges are induced by the mechanical distortion. From this viewpoint, positive charges and negative charges are induced by positive distortion (+) and negative distortion (−) The positive charge amount is equivalent to the hatched area enclosed by the solid line curve 91, while the negative charge amount is equivalent to the hatched areas enclosed by each part of the solid line curves 92 and 93. As is apparent from the graph, the positive and negative charges cancel each other out, thus neither positive charges nor negative charges are left on the vibrator 20b (FIG. 7), with the result that no filtered output regarding the third order vibration mode is produced from the output OUT. Consequently, the deleterious third order spurious mode can be suppressed.

As previously mentioned, the present invention produces another advantage, other than the above-mentioned third order spurious mode suppression, in that the input impedance and the output impedance of the mechanical filter can be easily adjusted to a desired value. In recent years, with the progress of large scale integrated (LSI) circuits, it is often necessary to differentiate between the values of the input impedance $Z_{in}$ and the output impedance $Z_{out}$ of the mechanical filter 50, specifically, for instance, $Z_{in} < Z_{out}$. For example, such a difference between the input and output impedances is often required in the design of a mechanical filter to be provided with, at its input and output, a C-MOS LSI circuit, in order to reduce the voltage attenuation loss through the mechanical filter to as little as possible.

The aforesaid relationship of $Z_{in} < Z_{out}$, particularly the larger output impedance $Z_{out}$, can also be performed by the slits S in the output side longitudinal mode vibrator 20b. No such slit S is formed in the input side longitudinal mode vibrator 20a (FIG. 5). Each slit S can be obtained by using, for example, a laser beam incident onto the metal film 12b, 12'b. The metal films shown in FIG. 7 are electrically separated, into inside and outside metal films, due to the existence of the slits S therebetween. Therefore, the whole length $L_M$ of each electrode, i.e., the metal film (12b, 12'b) at the output side, is very much shorter than the whole length $L_P$ of each electrode, i.e., the metal film (12a, 12'a) at the input side; that is, the expression $L_P > L_M$ is created. The relationship $L_P > L_M$ is largely related with the relationship of the values $Z_{in}$ and $Z_{out}$.

Figure 10:
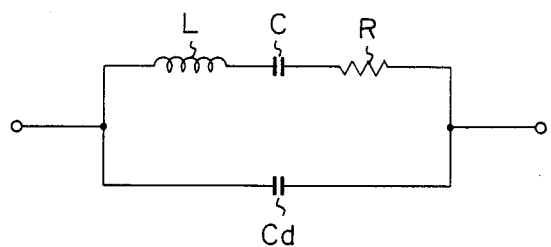
FIG. 10 is a circuit diagram showing a circuit equivalent to the longitudinal mode vibrator.

FIG. 10 is a circuit diagram equivalent to the longitudinal mode vibrator. Note, the equivalent circuit shown in FIG. 10 is common to each vibrator shown in FIG. 5 and FIG. 7. In FIG. 10, the symbol L denotes an equivalent inductance, C an equivalent capacitance, $C_d$ a damping capacitor, and R an equivalent resistance. In the equivalent circuit, a resonant frequency $f_r$ is determined by the equation $$f_r = \frac{1}{2\pi \sqrt{LC}}.$$

Figure 11:
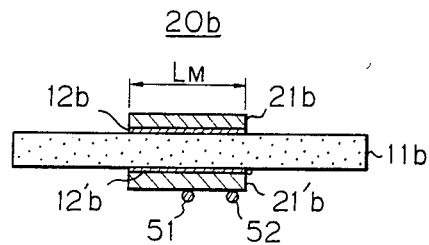
FIG. 11 is a cross-sectional view of a modification of a vibrator shown in FIG. 5.

The thus determined response frequency $f_r$ is the same, regardless of the slit S, in both the input and the output side vibrators 20a and 20b because the vibration frequency of the longitudinal mode vibrator is determined by relying on its length only. Accordingly, since the piezoelectric ceramic plates 11a and 11b have the same length, the resonant frequencies of the vibrators 20a and 20b coincide with each other. Assuming that the physical conditions of the input and output side vibrators are substantially the same, except that the latter has the slits S, a comparison is made below between the values of the equivalent inductances L thereof. The input side vibrator 20a, having an indentical cross-section to that in FIG. 6, has relatively large size electrodes, i.e., the metal films 12a and 12'a, since no slit is formed therein. This means that a high degree of electric-mechanical conversion efficiency is obtainable, and thereby, a low inductance L is established. While, the output side vibrator 20b (FIG. 7) with the slits S has relatively small size electrodes, i.e., the metal films 21b and 21'b. This means that, contrary to the above, a low degree of electric-mechanical conversion efficiency is obtainable, and thereby, a high inductance L is established. The low and high inductances L are proportional to the values of the impedances $Z_{in}$ and $Z_{out}$, and as a result, the above recited expression $Z_{in} < Z_{out}$ stands. In this case, it should be noted that the relationship $Z_{in} < Z_{out}$ is satisfied merely by the formation of the slits S. In this regard, it is also possible not to make outside electrodes, as shown in FIG. 11. FIG. 11 is a cross-sectional view of a modification of a vibrator shown in FIG. 7. As is seen from FIG. 11, no outside electrodes exist, but only inside electrodes, i.e., the metal films 12b and 12'b used are located immediately beneath the metal strips 21b and 21'b.

Figure 12:
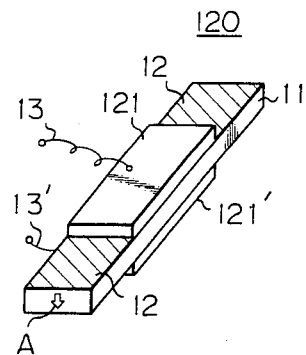
FIG. 12 is a perspective view of a piezoelectric ceramic vibrator used in a mechanical filter according to a second embodiment of the present invention.

FIG. 12 is a perspective view of a piezoelectric ceramic vibrator used in a mechanical filter according to a second embodiment of the present invention. A longitudinal mode piezoelectric ceramic vibrator 120 is assembled with metal plates (not metal strips) 121 and 121'. A major difference between the vibrators 20 (FIG. 2) and 120 (FIG. 12) resides in their thicknesses. That is, each metal plate (121, 121') is relatively thick, while the aforesaid metal strip (21, 21') is relatively thin.

Figure 13:
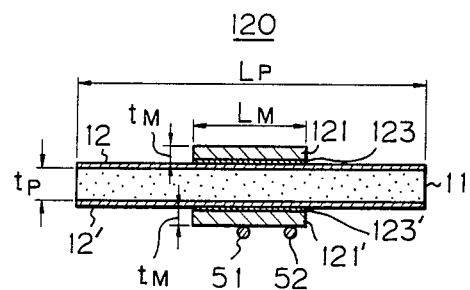
FIG. 13 is a cross-sectional view of the longitudinal mode vibrator 120 shown in FIG. 12.

FIG. 13 is a cross-sectional view of the longitudinal mode vibrator 120 shown in FIG. 12. In FIG. 13, the characters $t_M$ and $t_P$ denote the individual thicknesses of the piezoelectric ceramic plate 11 and the metal plate 121 of the top side. The bottom side metal plate 121' has the same thickness $t_M$. All other conditions for the metal plates 121, 121' are identical to those of the metal strips 21 and 21'. That is, the metal plates 121 and 121' are made of constant modulus alloys, have the same configurations as each other, serve as electrodes, preferably satisfy the relationship $L_M < L_P$, and are positioned in such a manner that the individual centers thereof are aligned with the center of the ceramic plate 11. The only difference resides in their thicknesses, as mentioned above. These metal plates 121 and 121' are fixed to the individual metal films 12 and 12' with soldering mediums 123 and 123', respectively. Thus, the metal plate (121, 121') is relatively thicker than the metal strip (21, 21'), and can be defined absolutely as below. Assuming that the ratio $t_M/t_P$ is about 0.05 for the metal strip (21, 21'), the ratio $t_M/t_P$ is about 0.5 for the metal plates (121, 121').

In other words, the sum of the thicknesses of the metal plates 121 and 121', i.e., $2 \times t_M$, is determined to be about equal to the thickness $t_P$ of the piezoelectric ceramic plate 11, i.e., $2t_M \approx t_P$.

Figure 14:
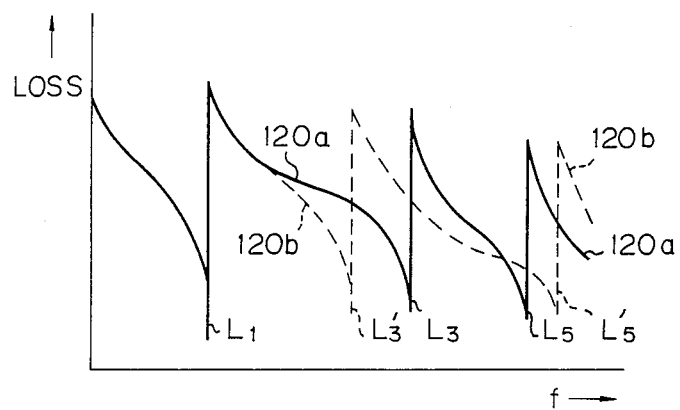
FIG. 14 is a graph depicting frequency response characteristics of the longitudinal mode vibrator 120 shown in FIGS. 12 and 13.
Figure 15:
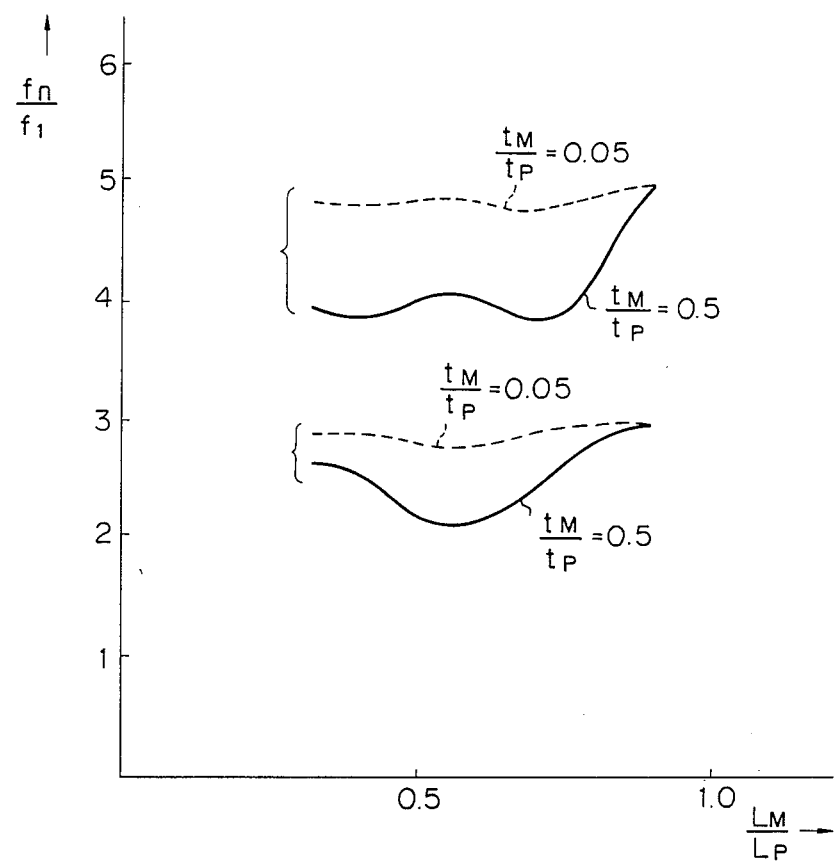
FIG. 15 is a graph explaining the relationship between $t_M/t_P$ and $L_M/L_P$.

According to the second embodiment, the spurious modes can be suppressed by employing thick constant modulus alloy members, i.e., the metal plates 121 and 121'. FIG. 14 is a graph depicting frequency response characteristics of the longitudinal mode vibrator 120 shown in FIGS. 12 and 13. The abscissa and the ordinate indications are the same as those in FIGS. 3 and 8 and the characters $L_1$, $L_3(L'_3)$ and $L_5(L'_5)$ represent the same elements as those in FIGS. 3 and 8. In FIG. 14, a solid line curve "120a" represents a characteristic of an input side longitudinal mode vibrator 120a (illustrated later), the ratio $L_M/L_P$ in length of which is set as equal to 0.817, and a broken line curve "120b" represents a characteristic of an output side longitudinal mode vibrator 120b (illustrated later), the ratio $L_M/L_P$ in length of which is set as equal to 0.667. Attention should be paid to the fact that, in FIG. 14, the frequency response characteristics vary according to variations of the ratio $L_M/L_P$. This is derived from the approach of the thickness $t_M$ of the metal plate 121, 121' to the thickness $t_P$ of the ceramic plate 11, and it may be proved by experiment that the above-mentioned fact revealed in FIG. 14 cannot be seen, if the thickness $t_M$ is very small, such as $t_M/t_P=0.05$. If not, the thick metal plates 121 and 121' construct, together with the ceramic plate 11, a compound vibrator. Details of this will be clarified below with reference to FIG. 15. FIG. 15 is a graph explaining a relationship between $t_M/t_P$ and $L_M/L_P$. The abscissa indicates the ratio $L_M/L_P$ and the ordinate indicates a ratio $f_n/f_1$. The symbol $f_n$ denotes each frequency of a longitudinal vibration mode of the n-th (n=1, 3, 5) order. It is important to note that, in FIG. 15, the frequency characteristics of the longitudinal mode vibrator are not responsive to the ratio $L_M/L_P$, if the ratio $t_M/t_P$ is as small as 0.05, as in the vibrator 20 shown in FIG. 2, but are inversely and remarkably responsive thereto if the ratio $t_M/t_P$ is as large as 0.5, as in the vibrator 120 shown in FIG. 12. In the second embodiment, the spurious mode characteristics are improved by taking the above-mentioned fact, shown in FIG. 15, into consideration.

Figure 16:
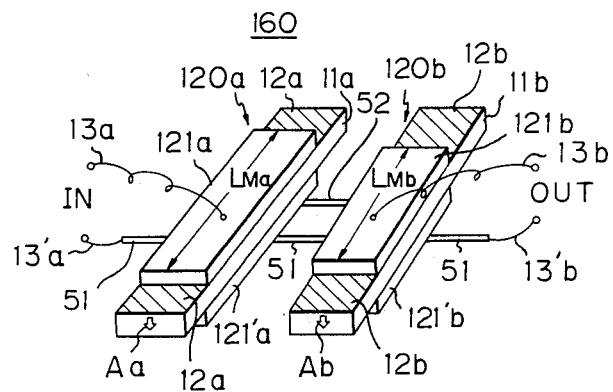
FIG. 16 is a perspective view illustrating a mechanical filter according to the second embodiment of the present invention.

FIG. 16 is a mechanical filter according to the second embodiment of the present invention. A mechanical filter 160 of the second embodiment is set up by using the longitudinal mode vibrator 120 shown in FIGS. 12 and 13. The lengths ($L_P$) of each of the input side vibrator 120a and the output side vibrator 120b are substantially the same, however the length ($L_M$) of the input side metal plate 121a (also 121'a), i.e., $L_{Ma}$, is different from the length, i.e., $L_{Mb}$, of the output side metal plate 121b (also 121'b). The difference in length $L_M$ between 121a and 121b reflects on the difference in the characteristics between the curves "120a" and "120b" shown in FIG. 14. In the mechanical filter 160, the spurious modes are greatly suppressed. This will be clarified with reference to FIG. 17.

Figure 17:
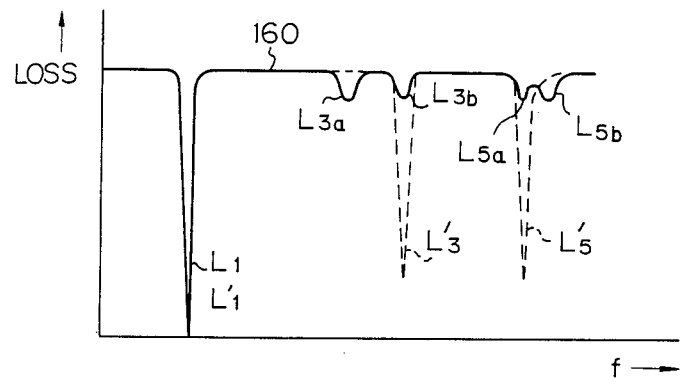
FIG. 17 is a graph depicting frequency response characteristics of the mechanical filter 160 shown in FIG. 16, which satisfies the relationship $L_{Ma} \neq L_{Mb}$.

FIG. 17 is a graph depicting frequency response characteristics of the mechanical filter 160 shown in FIG. 16, which satisfies the relationship $L_{Ma} \neq L_{Mb}$. The abscissa and the ordinate indications thereof are identical to those of FIGS. 3, 8, and 14. In the graph in FIG. 17, a solid line characteristic curve corresponds to the mechanical filter 160, in which the ratio $L_{Ma}/L_P$ of the input side vibrator 120a is differentiated from the ratio $L_{Mb}/L_P$ of the output side vibrator 120b, as is clear from FIG. 16. On the other hand, a broken line curve represents an identical characteristic curve which would be obtained if the ratio $L_{Ma}/L_P$ coincided with the ratio $L_{Mb}/L_P$. Consequently, the third order and fifth order spurious modes ($L_3$, $L_5$) can be greatly suppressed by using at least two longitudinal mode vibrators having different ratios of $L_M/L_P$. If the ratios $L_M/L_P$ of the vibrators coincide with each other, the resonant frequencies in each higher order vibration mode also coincide with each other, and therefore, the attenuation loss of one vibrator is added to that of the other vibrator at each resonant frequency, so that the broken line curve in FIG. 17 would be obtained. It is apparent that the broken line curve does not indicate an improvement in the spurious mode suppression, as does the solid line curve.

Referring to FIGS. 12, 13, and 16 again, although not illustrated therein, slits identical to the aforesaid slits S (FIG. 7) may also be introduced in at least the output side longitudinal mode vibrator 120b, if required for impedance adjustment. In this case, instead of forming such slits, it also may be possible to remove the corresponding metal films 12 and 12' (FIG. 13) located on the surfaces except for portions immediately beneath the metal plates 121 and 121'. Further, since the thick metal members, i.e., the metal plates 121a and 121b, are used, it also may be possible to form a coupler or couplers (refer to the metal wire member 52 in FIG. 16) as a one-piece construction with the metal plates 121a and 121b, as in the structure shown later in FIGS. 20A and 20B. In this case, it also may be possible to eliminate the support wire 51 (FIG. 16) to be connected between two nodal points, as in the structure shown later in FIGS. 18A and 18B.

Figure 18A:
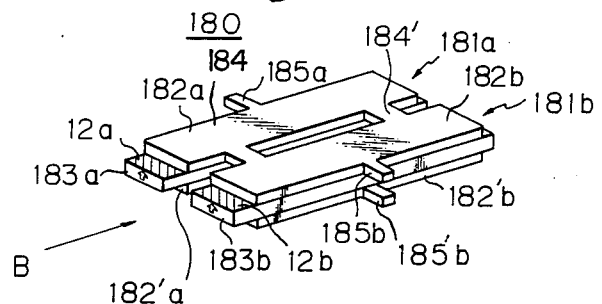
FIG. 18A is a perspective view of a mechanical filter according to a third embodiment of the present invention.
Figure 18B:
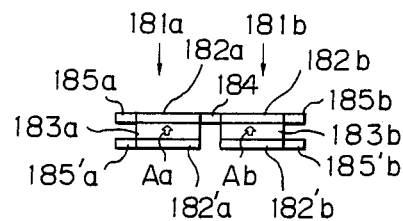
FIG. 18B is a front side view of the mechanical filter seen from the arrow B in FIG. 18A.

FIG. 18A is a perspective view of a mechanical filter according to a third embodiment of the present invention. FIG. 18B is a front side view of the mechanical filter seen from the arrow B in FIG. 18A. In the third embodiment, the mechanical filter 180 is comprised mainly of an input side longitudinal mode vibrator 181a and an output side longitudinal mode vibrator 181b, which are connected by couplers 184 and 184'. The couplers 184 an 184' are preferably formed as a one-piece construction with the metal plates 182a and 182b made of a constant modulus alloy. Individual metal plates 184'a and 182'b, made of a constant modulus alloy, sandwich the individual piezoelectric ceramic plates 183a and 183b, together with the metal plates 182a and 182b. The input side metal plates have input terminals 185a and 185'a. The output side metal plates have output terminals 185b and 185'b. Since the couplers 184 and 184' couple and support the vibrators 181a and 181b, no support means, such as the support wire 51, is needed.

Attention should be paid to the fact that, in FIGS. 18A and 18B, the thickness of the ceramic plate 183a is different from that of the ceramic plate 183b. Such a difference in thickness between the ceramic plates is effective for suppressing the higher order spurious mode. This will be briefly clarified below with reference to FIG. 19.

Figure 19:
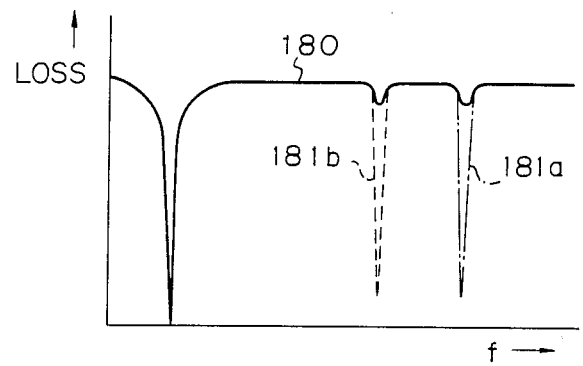
FIG. 19 is a graph depicting frequency response characteristics of the mechanical filter 180 shown in FIGS. 18A and 18B, which satisfies the relationship $t_{Pa} \neq t_{Pb}$.

FIG. 19 is a graph depicting frequency response characteristics of the mechanical filter 180 shown in FIGS. 18A and 18B. The abscissa and the ordinate indications thereof are identical to those of previous similar figures. In the graph shown in FIG. 19, a solid line characteristic curve corresponds to the mechanical filter 180. As is clear from the graph, the high order spurious mode suppression is remarkable. This will be briefly explained below.

Where only the longitudinal mode vibrator 181a is taken for measurement, the thickness-extensional spurious vibration mode would be as depicted by the chain dotted line curve 181a. Similarly, when only the longitudinal mode vibrator 181b is taken for measurement, the thickness-extensional spurious vibration mode would be as depicted by the broken line curve 181b. Therefore, when these two vibrators 181a and 181b are coupled together to form up to filter, the individual different spurious vibrations thereof cancel each other out, so that the spurious vibrations are weakened, as depicted.

Referring to FIGS. 18A and 18B again, although not illustrated therein, slits identical to the aforesaid slits S (FIG. 7) also may be introduced in at least the output side longitudinal mode vibrator 181b, if required for impedance adjustment. In this case, instead of forming such slits, it also may be possible to remove the corresponding metal films 12b located on the surfaces except for portions immediately beneath the metal plates 182b and 182'b.

Figure 20A:
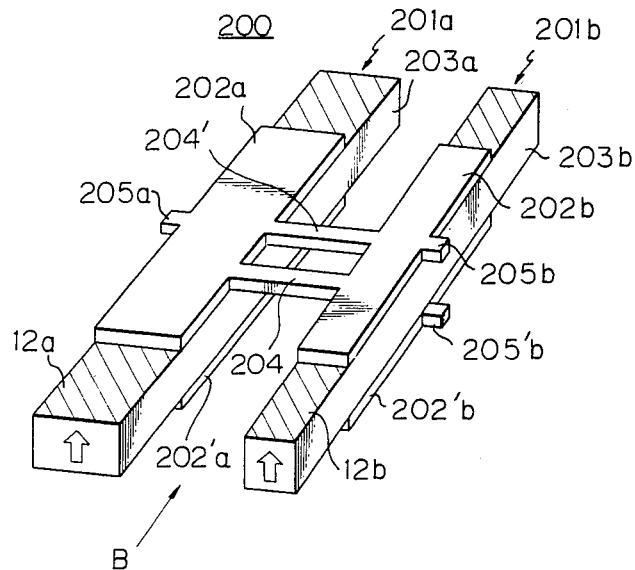
FIG. 20A is a perspective view of a mechanical filter according to a fourth embodiment of the present invention.
Figure 20B:
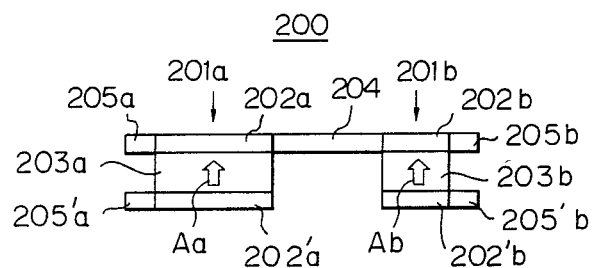
FIG. 20B is a front side view of the mechanical filter seen from the arrow C in FIG. 20A.

FIG. 20A is a perspective view of a mechanical filter according to a fourth embodiment of the present invention. FIG. 20B is a front side view of the mechanical filter seen from the arrow C in FIG. 20A. In the fourth embodiment, the mechanical filter 200 is comprised mainly of an input side longitudinal mode vibrator 201a and an output side longitudinal mode vibrator 201b, which are connected by a coupler 204 and a support bar 204'. The coupler 204 and the support bar 204' are preferably formed as a one-piece construction with the metal plates 202a and 202b made of constant modulus alloy. The individual metal plates 202'a and 202'b, made of constant modulus alloy, sandwich the individual piezoelectric ceramic plates 203a and 203b, together with the metal plates 202a and 202b. The input side metal plates have input terminals 205a and 205'a. The output side metal plates have output terminals 205b and 205'b. Note, another coupler may be introduced therein instead of the support bar 204'.

Attention should be paid to the fact that, in FIGS. 20A and 20B, the width of the ceramic plate 203a (also the metal plates 202a, 202'a) is different from that of the ceramic plate 203b (also the metal plates 202b, 202'b). Such a difference in width between the plates is effective for suppressing the width-extensional spurious vibration mode. This will be briefly clarified below with reference to FIG. 21.

Figure 21:
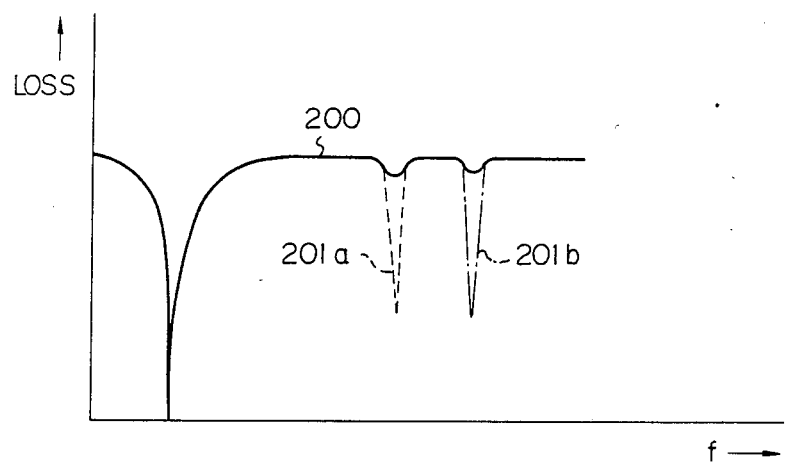
FIG. 21 is a graph depicting frequency response characteristics of the mechanical filter 200 shown in FIGS. 20A and 20B, which satisfies the relationship $W_{Pa} \neq W_{Pb}$.

FIG. 21 is a graph depicting frequency response characteristics of the mechanical filter 200 shown in FIGS. 20A and 20B. The abscissa and the ordinate indications thereof are identical to those of previous similar figures. In the graph shown in FIG. 21, a solid line characteristic curve corresponds to the mechanical filter 200. As is clear from the graph, the width-extensional spurious vibration mode suppression is remarkable. This will be briefly explained below. If only the longitudinal mode vibrator 201a is taken for measurement, the width-extensional spurious vibration mode would be as depicted by the broken line curve 201a. Similarly, if only the longitudinal mode vibrator 201b is taken for measurement, the width-extensional spurious vibration mode would be as depicted by the chain dotted line curve 201b. Therefore, when these two vibrators 201a and 201b are coupled together to set up the filter, the individual different spurious vibrations thereof cancel each other out, so that the spurious vibrations are weakened, as depicted.

Referring to FIGS. 20A and 20B again, although not illustrated therein, slits identical to the aforesaid slits S (FIG. 7) also may be introduced in at least the output side longitudinal mode vibrator 181b, if required for impedance adjustment. In this case, instead of forming such slits, it also may be possible to remove the corresponding metal films 12b located on the surfaces except for portions immediately beneath the metal plates 202b and 202'b.

As explained above in detail, the mechanical filter according to the present invention produces the advantages of, first, high stability with respect to the aforesaid temperature variations and aging, second, strong resistance to external mechanical impact and, third, requires no external electric band pass filter for suppressing the spurious mode.

We claim:

1. A mechanical filter having input and output sides comprising:
   an input side piezoelectric ceramic member and an output side piezoelectric ceramic member, each of said piezoelectric ceramic members having a center, top and bottom surfaces, a thickness in the direction between said top and bottom surfaces, a frequency temperature characteristic, a polarization in the direction of said thickness and a longitudinal vibrational mode;
   top and bottom constant modulus alloy members separately mounted on said top and bottom surfaces of said piezoelectric ceramic members, respectively, each pair of top and bottom constant modulus alloy members having the same configuration, a frequency-temperature characteristic opposite to said frequency-temperature characteristic of the piezoelectric ceramic member mounted therebetween, and centers, said centers of said top and bottom piezoelectric ceramic members being aligned with the center of the piezoelectric ceramic member mounted therebetween; and
   at least one coupler connected between either said top or said bottom side constant modulus alloy members mounted on said input and output side piezoelectric ceramic members.

2. A mechanical filter as set forth in claim 1, wherein said piezoelectric ceramic members have metal films formed on the top and bottom surfaces of each said piezoelectric ceramic member to which said constant modulus alloy members are secured.

3. A mechanical filter as set forth in claim 2, wherein each said constant modulus alloy member is shaped in the form of a metal strip.

4. A mechanical filter as set forth in claim 3, wherein each said metal strip has a length and each piezoelectric ceramic member has a length, said length of said metal strip being shorter than the length of the corresponding piezoelectric ceramic member.

5. A mechanical filter as set forth in claim 4, wherein each piezoelectric ceramic member has a length $L_P$, each constant modulus alloy member has a length $L_M$, and the length $L_p$, of at least one of said piezoelectric ceramic members, and the length $L_M$ of both said top and bottom metal strips mounted thereon are determined so as to satisfy the relationship $L_M = \frac{2}{3} L_P$ and wherein said metal films have slits formed therein at positions corresponding to both ends of said top and bottom side metal strips so that a third order spurious vibrational mode is suppressed.

6. A mechanical filter as set forth in claim 5, further comprising a support wire having two ends, both of said ends of said support wire being connected to either the top or bottom metal strips, at the respective centers of said input and output side piezoelectric ceramic members, wherein said centers of said input and output side piezoelectric ceramic members are nodal points, and wherein said coupler is connected between said input and output side piezoelectric ceramic members at respective points other than said nodal points.

7. A mechanical filter as set forth in claim 6, wherein said relationship $L_M = \frac{2}{3} L_P$ is established for the output side piezoelectric ceramic member.

8. A mechanical filter as set forth in claim 7, wherein said top and bottom surfaces of each said piezoelectric ceramic members have a first portion covered by said metal films and said metal strips and a second portion which is exposed.

9. A mechanical filter as set forth in claim 8, wherein each piezoelectric ceramic member has a thickness $t_P$, each metal strip has a thickness $t_M$, and the ratio between the thickness $t_P$ of each piezoelectric ceramic member and the thickness $t_M$ of each said thin metal strip is about 0.05, so that $t_M/t_P = 0.05$.

10. A mechanical filter as set forth in claim 2, wherein each constant modulus alloy member is shaped in the form of a metal plate.

11. A mechanical filter as set forth in claim 10, wherein each metal plate has a length and each piezoelectric ceramic member has a length, said length of said metal strip being shorter than said length of the corresponding piezoelectric ceramic member.

12. A mechanical filter as set forth in claim 11, wherein each piezolectric ceramic member has a thickness $t_P$, each metal plate has a thickness $t_M$, and the thickness $t_p$ of each piezoelectric ceramic member is about twice the thickness $t_M$ of each metal plate.

13. A mechanical filter as set forth in claim 12, wherein each piezoelectric ceramic member has a length $L_p$, each metal plate mounted on an input side piezoelectric ceramic member has a length $L_{Ma}$ and each metal plate mounted on an output side piezoelectric ceramic has a length $L_{Mb}$, wherein the lengths $L_p$ of said input and output side piezoelectric ceramic members are substantially the same, and wherein the length $L_{Ma}$, of said input side metal plate is differentiated from the length $L_{Mb}$ of said output side metal plate, so that higher order spurious vibrational modes are suppressed.

14. A mechanical filter as set forth in claim 13, further comprising a support wire having two ends, both of said ends of said support wire being connected to either said top or bottom metal plates, at the respective centers of said input and output side piezoelectric ceramic members, wherein said centers of said input and output side piezoelectric ceramic members are nodal points, and wherein said coupler is connected between said input and output side piezoelectric members at respective points other than said nodal points.

15. A mechanical filter as set forth in claim 13, wherein said couplers have two ends, both ends of said couplers being connected to either said top or bottom metal plates, at respective points other than said nodal points, and the couplers are formed as a one-piece plate together with said metal plates.

16. A mechanical filter as set forth in claim 13, further comprising a support member having two ends, both of said ends of said support member being connected to either said top or bottom metal plates, at the respective centers of said input and output side piezoelectric ceramic members, wherein said coupler is connected therebetween at respective points other than said nodal points, and wherein the support members and couplers are formed as a one-piece plate together with said metal plates.

17. A mechanical filter as set forth in claim 14, wherein said metal films have slits formed therein at positions corresponding to both ends of said top and bottom metal plates bonded to the output side piezoelectric ceramic member.

18. A mechanical filter as set forth in claim 15, wherein said films have slits formed therein at positions corresponding to both ends of said top and bottom metal plates bonded to the output side piezoelectric ceramic member.

19. A mechanical filter as set forth in claim 16, wherein said metal films have slits formed therein at positions corresponding to both ends of said top and bottom metal plates bonded to the output side piezoelectric ceramic member.

20. A mechanical filter as set forth in claim 17, wherein said top and bottom surfaces of said output side piezoelectric ceramic member have a first portion covered by said metal films and said metal plates and a second portion which is exposed.

21. A mechanical filter as set forth in claim 18, wherein said top and bottom surfaces of said output side piezoelectric ceramic member have a first portion covered by said metal films and said metal plates and a second portion which is exposed.

22. A mechanical filter as set forth in claim 19, wherein said top and bottom surfaces of said output side piezoelectric ceramic member have a first portion covered by said metal films and said metal plates and a second portion which is exposed.

23. A mechanical filter as set forth in claim 12, wherein the thickness of said input side piezoelectric ceramic member is differentiated from the thickness of said output side piezoelectric ceramic member, so that the thickness-extensional spurious vibration modes are suppressed.

24. A mechanical filter as set forth in claim 23, wherein said couplers have two ends, both ends of said couplers being connected to either said top or bottom metal plates, at respective points other than nodal points, and the couplers are formed as a one-piece plate together with said metal plates.

25. A mechanical filter as set forth in claim 23, further comprising a support member having two ends, both of said ends of said support member being connected to either said top or bottom metal plates, at the respective centers of said input and output side piezoelectric ceramic members, wherein said couplers is connected between said input and output side piezoelectric ceramic members at respective points other than said nodal points, and wherein the support members and couplers are formed as a one-piece plate together with said metal plates.

26. A mechanical filter as set forth in claim 24, wherein said metal films have slits formed therein at positions corresponding to both ends of said top and bottom metal plates bonded to the output side piezoelectric ceramic member.

27. A mechanical filter as set forth in claim 25, wherein said metal films have slits formed therein at positions corresponding to both ends of said top and bottom metal plates bonded to the output side piezoelectric ceramic member.

28. A mechanical filter as set forth in claim 26, wherein said top and bottom surfaces of said output side piezoelectric ceramic member have a first portion covered by said metal films and said metal plates and a second portion which is exposed.

29. A mechanical filter as set forth in claim 27, wherein said top and bottom surfaces of said output side piezoelectric ceramic member have a first portion covered by said metal films and said metal plate and a second portion which is exposed.

30. A mechanical filter as set forth in claim 12, wherein said input and output side piezoelectric ceramic members have a width, said top and bottom metal plates have a width and the width of said input side piezoelectric ceramic member and said top and bottom metal plates bonded thereto are differentiated from the width of said output side piezoelectric ceramic member and said top and bottom metal plates bonded thereto, so that width-extensional spurious vibrational modes are suppressed.

31. A mechanical filter as set forth in claim 30, wherein said couplers have two ends, both ends of said couplers being connected to either said top or bottom metal plates, at respective points other than said nodal points, and the couplers are formed as a one-piece plate together with said metal plates.

32. A mechanical filter as set forth in claim 30, further comprising a support member having two ends, both of said ends of said support member being connected to either said top or bottom side metal plates, at the respective centers of said input and output side piezoelectric ceramic members, wherein said coupler is connected between said input and output side piezoelectric ceramic members at respective points other than said nodal points, and wherein the support members and couplers are formed as a one-piece plate together with said metal plates.

33. A mechanical filter as set forth in claim 31, wherein said metal films have slits formed therein at positions corresponding to both ends of said top and bottom side metal plates bonded to the output side piezoelectric ceramic member.

34. A mechanical filter as set forth in claim 32, wherein said metal films have slits formed therein at positions corresponding to both ends of said top and bottom side metal plates bonded to the output side piezoelectric ceramic member.

35. A mechanical filter as set forth in claim 33, wherein said top and bottom surfaces of said output side piezoelectric ceramic member have a first portion covered by said metal films and said metal plates and a second portion which is exposed.

36. A mechanical filter as set forth in claim 34, wherein said top and bottom surfaces of said output side piezoelectric ceramic member have a first portion covered by said metal films and said metal plates and a second portion which is exposed.

37. A mechanical filter comprising:
first and second piezoelectric ceramic members each having first and second surfaces, a thickness in the direction between the first and second surfaces, a polarization in the direction of the thickness, and a frequency-temperature characteristic;
a first pair of constant modulus alloy members mounted on the first and second surfaces of the first piezoelectric ceramic member having a frequency-temperature characteristic opposite to the frequency-temperature characteristic of the first piezoelectric ceramic member;

a second pair of constant modulus alloy members mounted on the first and second surfaces of the second piezoelectric ceramic member having a frequency-temperature characteristic opposite to the frequency-temperature characteristic of the second piezoelectric ceramic member; and at least one coupler connected between either the constant modulus alloy members mounted on the first surface of the first and second piezoelectric ceramic members or the constant modulus alloy members mounted on the second surface of the first and second piezoelectric ceramic members.

38. A mechanical filter according to claim 37 wherein the first and second said piezoelectric ceramic members and the first and second pairs of constant modulus alloy members have centers and the centers of each pair of constant modulus alloy members is aligned with the center of the piezoelectric ceramic member mounted between each pair of constant modulus alloy members.

* * * * *

UNITED STATES PATENT AND TRADEMARK OFFICE
CERTIFICATE OF CORRECTION

PATENT NO. : 4,555,682

DATED : November 26, 1985

INVENTOR(S) : Gounji et al.

It is certified that error appears in the above-identified patent and that said Letters Patent is hereby corrected as shown below:

Col. 2, line 32, "2/3lp" should be --$2/3L_p$--.

Col. 4, line 67, delete "charge in-";
 line 68, delete "duced"; after "negative" insert --charges induced--.

Col. 6, line 9, after "(-)" insert --respectively.--;
 line 51, "with" should be --to--.

Col. 9, line 44, "184'a" should be --182'a--.

Col. 10, line 9, "up to" should be --the--.

Col. 12, line 43, after "ceramic" insert --member--.

Signed and Sealed this

Twenty-second Day of April 1986

[SEAL]

Attest:

DONALD J. QUIGG

Attesting Officer

Commissioner of Patents and Trademarks